(12) United States Patent
Li et al.

(10) Patent No.: US 10,886,495 B2
(45) Date of Patent: Jan. 5, 2021

(54) ORGANIC LIGHT-EMITTING DIODE DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Yansong Li, Beijing (CN); Haidong Wu, Beijing (CN); Na Li, Beijing (CN); Xiaobo Du, Beijing (CN); Guanyin Wen, Beijing (CN); Xing Fan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 17 days.

(21) Appl. No.: 16/209,260

(22) Filed: Dec. 4, 2018

(65) Prior Publication Data

US 2019/0326546 A1 Oct. 24, 2019

(30) Foreign Application Priority Data

Apr. 24, 2018 (CN) .......................... 2018 1 0374916

(51) Int. Cl.
 *H01L 51/52* (2006.01)
 *H01L 51/56* (2006.01)
(52) U.S. Cl.
 CPC ...... *H01L 51/5221* (2013.01); *H01L 51/5206* (2013.01); *H01L 51/5253* (2013.01); *H01L 51/5271* (2013.01); *H01L 51/56* (2013.01); *H01L 2251/303* (2013.01); *H01L 2251/308* (2013.01); *H01L 2251/533* (2013.01); *H01L 2251/5353* (2013.01); *H01L 2251/558* (2013.01)

(58) Field of Classification Search
 CPC ............. H01L 51/5271; H01L 51/5265; H01L 51/5218; H01L 51/5221; H01L 51/5275; H01L 51/5234; H01L 51/5281
 See application file for complete search history.

(56) References Cited

U.S. PATENT DOCUMENTS

| 2004/0031977 | A1* | 2/2004 | Brown | H01L 51/5259 257/222 |
| 2004/0141106 | A1* | 7/2004 | Wu | G02F 1/133603 349/69 |
| 2005/0093435 | A1* | 5/2005 | Suh | H01L 27/322 313/504 |

(Continued)

FOREIGN PATENT DOCUMENTS

| CN | 102270750 A | 12/2011 |
| CN | 102347452 A | 2/2012 |
| CN | 106531773 A | 3/2017 |

OTHER PUBLICATIONS

First Office Action for Chinese Application No. 201810374916.1, dated Jul. 9, 2019, 8 Pages.

*Primary Examiner* — Zandra V Smith
*Assistant Examiner* — John M Parker
(74) *Attorney, Agent, or Firm* — Brooks Kushman P.C.

(57) ABSTRACT

An OLED display substrate, a manufacturing method thereof, and a display device are provided. The OLED display substrate includes a reflective cathode layer, an organic light-emitting layer, a transparent anode layer and a high reflection layer sequentially arranged on a substrate, and the high reflection layer has reflectivity greater than a threshold.

18 Claims, 2 Drawing Sheets

(56) References Cited

U.S. PATENT DOCUMENTS

| | | | |
|---|---|---|---|
| 2005/0194896 A1* | 9/2005 | Sugita | B82Y 30/00 |
| | | | 313/506 |
| 2010/0096617 A1* | 4/2010 | Shanks | H01L 51/5271 |
| | | | 257/13 |
| 2012/0018749 A1 | 1/2012 | Lee et al. | |
| 2012/0315714 A1* | 12/2012 | Shanks | H05B 33/28 |
| | | | 438/29 |
| 2017/0207420 A1* | 7/2017 | Yang | H01L 51/504 |
| 2019/0006428 A1 | 1/2019 | Qi et al. | |

* cited by examiner

US 10,886,495 B2

ORGANIC LIGHT-EMITTING DIODE DISPLAY SUBSTRATE, MANUFACTURING METHOD THEREOF, AND DISPLAY DEVICE

CROSS-REFERENCE TO RELATED APPLICATION

This application claims priority to Chinese Patent Application No. 201810374916.1 filed on Apr. 24, 2018, which is incorporated herein by reference in its entirety.

TECHNICAL FIELD

The present disclosure relates to the field of display technology, in particular to an Organic Light-Emitting Diode (OLED) display substrate, a manufacturing method thereof, and a display device.

BACKGROUND

Currently, a cathode of an Active Matrix OLED (AMO-LED) display device needs to be made of a metal material having a low work function, but the metal material has relatively high reflectivity to an ambient light beam, so a contrast of the display device may be reduced. In addition, light transmissivity of the metallic cathode is relatively low, so it is necessary to provide the cathode with a very small thickness, and thereby a sheet resistance of the cathode is relatively large, resulting in defects such as uneven display brightness due to a voltage drop for the cathode in the display device.

SUMMARY

An object of the present disclosure is to provide an OLED display substrate, a manufacturing method thereof, and a display device.

In one aspect, the present disclosure provides in some embodiments an OLED display substrate, including a reflective cathode layer, an organic light-emitting layer, a transparent anode layer, and a high reflection layer arranged sequentially on a substrate. The high reflection layer has reflectivity greater than a threshold and the high reflection layer is configured to reflect a light beam emitted from the organic light-emitting layer.

In a possible embodiment of the present disclosure, the high reflection layer is of a multi-layered structure, and includes at least two first refractive material layers and at least one second refractive material layer alternately arranged one on top of another, and each first refractive material layer has a refractive index greater than that of the second refractive material layer.

In a possible embodiment of the present disclosure, each first refractive material layer has a thickness of $\lambda/4n_1$, and each second refractive material layer has a thickness of $\lambda/4n_2$, where $\lambda$ represents a wavelength of the light beam emitted from the organic light-emitting layer, $n_1$ represents the refractive index of the first refractive material layer, and $n_2$ represents the refractive index of the second refractive material layer.

In a possible embodiment of the present disclosure, the high reflection layer includes two first refractive material layers and one second refractive material layer, or three first refractive material layers and two second refractive material layers.

In a possible embodiment of the present disclosure, the high reflection layer sequentially includes, in a direction toward the transparent anode layer, a first refractive material layer having a thickness in a range of from 120 nm to 140 nm and a refractive index in a range of from 2.2 to 2.4, a second refractive material layer having a thickness in a range of from 120 nm to 140 nm and a refractive index in a range of from 1.5 to 1.7, a first refractive material layer having a thickness in a range of from 120 nm to 140 nm and a refractive index in a range of from 2.2 to 2.4, a second refractive material layer having a thickness in a range of from 120 nm to 140 nm and a refractive index in a range of from 1.5 to 1.7, and a first refractive material layer having a thickness in a range of from 120 nm to 140 nm and a refractive index in a range of from 2.2 to 2.4.

In a possible embodiment of the present disclosure, each first refractive material layer is made of titanium oxide ($TiO_2$) or Indium Tin Oxide (ITO), and each second refractive material layer is made of organic resin.

In a possible embodiment of the present disclosure, the reflective cathode layer is configured to reflect the light beam reflected by the high reflection layer, so as to form an optical resonator between the high reflection layer and the reflective cathode layer.

In a possible embodiment of the present disclosure, the reflective cathode layer is made of metal and has a thickness greater than or equal to 100 nm.

In a possible embodiment of the present disclosure, the threshold is 6%, and the reflectivity of the high reflection layer is not greater than 40%.

In a possible embodiment of the present disclosure, the OLED display substrate further includes an encapsulation layer arranged on the high reflection layer, or at least a portion of the high reflection layer further serves as the encapsulation layer of the OLED display panel.

In another aspect, the present disclosure provides in some embodiments a display device including the above-mentioned OLED display substrate.

In yet another aspect, the present disclosure provides in some embodiments a method for manufacturing an OLED display substrate, including forming a reflective cathode layer, an organic light-emitting layer, a transparent anode layer and a high reflection layer sequentially on a substrate. The high reflection layer has reflectivity greater than a threshold, and the high reflection layer is configured to reflect a light beam emitted from the organic light-emitting layer.

In a possible embodiment of the present disclosure, forming the high reflection layer includes: forming at least two first refractive material layers and at least one second refractive material layer alternately on the transparent anode layer, and each first refractive material layer has a refractive index greater than that of the second refractive material layer.

In a possible embodiment of the present disclosure, the method further includes forming an encapsulation layer on the high reflection layer.

In a possible embodiment of the present disclosure, the forming at least two first refractive material layers and at least one second refractive material layer alternately on the transparent anode layer includes: forming sequentially on the transparent anode layer, in a direction toward the transparent anode layer, a first refractive material layer having a thickness in a range of from 120 nm to 140 nm and a refractive index in a range of from 2.2 to 2.4, a second refractive material layer having a thickness in a range of from 120 nm to 140 nm and a refractive index in a range of from 1.5 to 1.7, a first refractive material layer having a thickness in a range of from 120 nm to 140 nm and a refractive index in a range of from 2.2 to 2.4, a second refractive material layer having a thickness in a range of from 120 nm to 140 nm and a refractive index in a range of from 1.5 to 1.7, and a first refractive material layer having a thickness in a range of from 120 nm to 140 nm and a refractive index in a range of from 2.2 to 2.4.

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
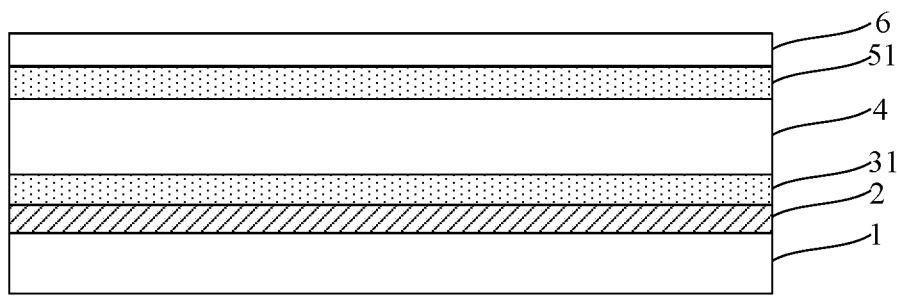
FIG. 1 is a schematic view showing a top-emission OLED display substrate in related art.

As shown in FIG. 1, a top-emission OLED display substrate in related art includes a reflection layer 2, an anode 31, an organic light-emitting layer 4, a cathode 51 and an encapsulation layer 6 arranged sequentially on a substrate 1. The substrate 1 includes a base substrate and a driving circuit arranged on the base substrate. The organic light-emitting layer 4 may include Hole Injection Layer (HIL), a Hole Transport Layer (HTL), an Electron Barrier Layer (EBL), an Emitting Layer (EML) (also called a light-emitting layer), an Electron Transport Layer (ETL) and an Electron Injection Layer (EIL). The cathode 51 needs to be made of a metal material having a low work function, but the metal material has relatively high reflectivity to an ambient light beam, so a contrast of a display device may be reduced. In addition, light transmissivity of the cathode 51 is relatively low, so it is necessary to provide the cathode 51 with a very small thickness, and thereby a sheet resistance of the cathode 51 is relatively large, resulting in uneven display brightness of the display device due to a voltage drop for the cathode 51.

Figure 2:
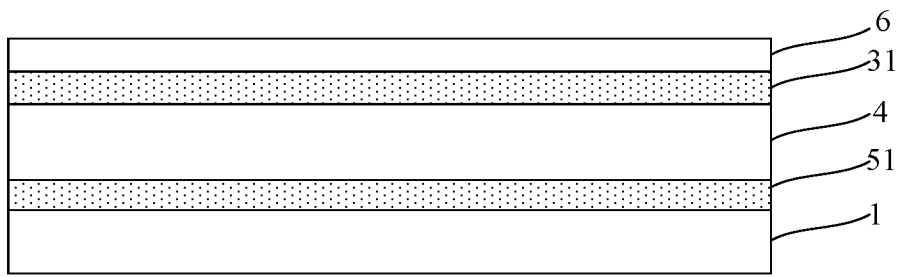
FIG. 2 is a schematic view showing the top-emission OLED display substrate in an inverted manner in related art.

In order to solve this problem, an inverted OLED display substrate has been proposed in the related art. As shown in FIG. 2, for the inverted OLED display substrate, a position of the cathode 51 and a position of the anode 31 are replaced with each other. In other words, for the top-emission OLED display substrate in the related art, the anode 31 is arranged below the cathode 51, while for the inverted top-emission OLED display substrate, the cathode 51 is below the anode 31. However, the anode 31 of the inverted OLED display substrate is a composite thin film made of ITO or Indium Zinc Oxide (IZO) having very high light transmissivity, and thus its reflectivity is very low, so it is impossible to form the optical resonator, and thereby the luminous efficiency, color gamut and color purity of the inverted OLED display substrate may be adversely affected. In the top-emission OLED display substrate of the related art, the metallic cathode thin film is a semitransparent thin film having certain reflectivity, so it is able to form the optical resonator (i.e., an optical microcavity) between the metallic cathode and the reflection layer at the bottom of the OLED display substrate. Through the optical resonator, it is able to improve the light extraction efficiency at a specific wavelength and narrow the spectrum, thereby to improve the luminous efficiency, color gamut and color purity of the display substrate.

An object of the present disclosure is to provide an OLED display substrate, a manufacturing method thereof and a display device, so as to improve the luminous efficiency, color gamut and color purity of the inverted OLED display substrate.

Figure 3:
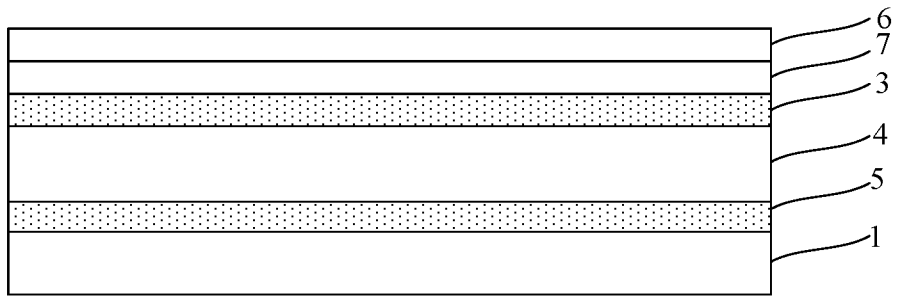
FIG. 3 is a schematic view showing an OLED display substrate according to some embodiments of the present disclosure.

As shown in FIG. 3, the present disclosure provides in some embodiments an OLED display substrate, which includes a reflective cathode layer 5, an organic light-emitting layer 4, a transparent anode layer 3, and a high reflection layer 7 arranged sequentially on a substrate 1. The high reflection layer 7 has reflectivity greater than a threshold, and the high reflection layer 7 is configured to reflect a light beam emitted from the organic light-emitting layer.

According to the embodiments of the present disclosure, the high reflection layer 7 having certain reflectivity and configured to reflect the light beam emitted from the organic light-emitting layer 4 is arranged on the transparent anode layer, so as to form an optical resonator (i.e., an optical microcavity) between the high reflection layer 7 and the reflective cathode layer 5 at the bottom of the OLED display substrate. As a result, it is able to improve the light extraction efficiency at a specific wavelength, narrow the spectrum, and improve the luminous efficiency, color gamut and color purity of the OLED display substrate, thereby to prevent the luminous efficiency, color gamut and color purity of the inverted OLED display substrate from being adversely affected due to the relatively low reflectivity of the anode.

Figure 4:
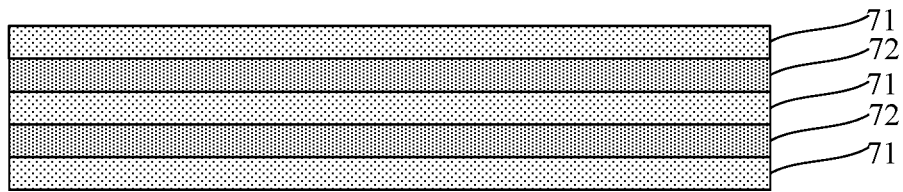
FIG. 4 is a schematic view showing a high reflection layer according to some embodiments of the present disclosure.
Figure 5:
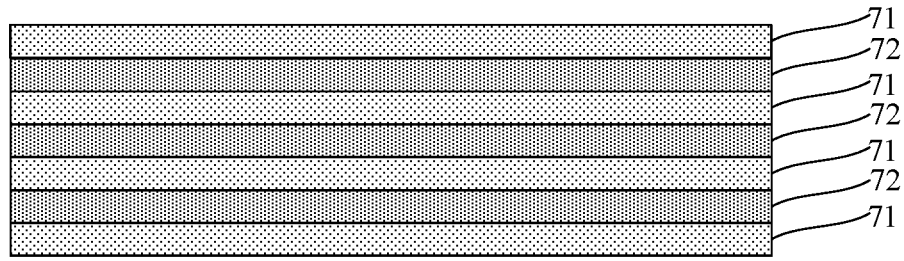
FIG. 5 is a schematic view showing another high reflection layer according to some embodiments of the present disclosure.
Figure 7:
FIG. 7 is a schematic view showing yet another high reflection layer according to some embodiments of the present disclosure.

In a possible embodiment of the present disclosure, the high reflection layer 7 may be of multi-layered structure consisting of an odd number of layers. To be specific, as shown in FIGS. 4, 5 and 7, the high reflection layer 7 may include at least two first refractive material layers 71 and at least one second refractive material layer 72 arranged alternately one on top of another. The quantity of the first refractive material layers and the quantity of the second refractive material layers 72 may be determined based on the reflectivity of the high reflection layer 7 to be formed. Each first refractive material layer 71 has a refractive index greater than that of the second refractive material layer 72.

To be specific, each first refractive material layer 71 may have a thickness of $\lambda/4n_1$, and each second refractive material layer 72 may have a thickness of $\lambda/4n_2$, where $\lambda$ represents a wavelength of the light beam emitted from the organic light-emitting layer 4, $n_1$ represents the refractive index of the first refractive material layer 71, and $n_2$ represents the refractive index of the second refractive material layer 72. Through the first refractive material layer 71 with the above thickness and the second refractive material layer 72 with the above thickness, it is able for the light beam to pass through the high reflection layer 7 more easily, thereby to optimize the light extraction efficiency.

Correspondences among the quantity of the first refractive material layers 71 and the quantity of the second refractive material layers 72, the refractive indices of the first refractive material layer 71 and the second refractive material layer 72 and the reflectivity of the high reflection layer 7 may be shown in Tables 1 to 3. Table 1 shows a situation where the high reflection layer 7 includes two first refractive material layers 71 and one second refractive material layer 72 alternately arranged one on top of another as shown in FIG. 7, Table 2 shows a situation where the high reflection layer 7 includes three first refractive material layers 71 and two second refractive material layers 72 alternately arranged one on top of another as shown in FIG. 4, and Table 3 shows a situation where the high reflection layer 7 includes four first refractive material layers 71 and three second refractive material layers 72 alternately arranged one on top of another as shown in FIG. 5.

TABLE 1

| Reflectivity of high reflection layer | Refractive index of second refractive material layer | | |
|---|---|---|---|
| | 1.5 | 1.6 | 1.7 |
| Refractive index of first refractive material layer 2.2 | 13.3% | 9.4% | 6.3% |
| 2.3 | 16.2% | 12.1% | 8.6% |
| 2.4 | 19.2% | 14.7% | 11.0% |

As shown in Table 1, the high reflection layer includes two first refractive material layers and one second refractive material layer. When each first refractive material layer has a refractive index of 2.2 and the second refractive material layer has a refractive index of 1.5, the high reflection layer may have the reflectivity of 13.3%. When each first refractive material layer has a refractive index of 2.2 and the second refractive material layer has a refractive index of 1.6, the high reflection layer may have the reflectivity of 9.4%. When each first refractive material layer has a refractive index of 2.2 and the second refractive material layer has a refractive index of 1.7, the high reflection layer may have the reflectivity of 6.3%. When each first refractive material layer has a refractive index of 2.3 and the second refractive material layer has a refractive index of 1.5, the high reflection layer may have the reflectivity of 16.2%. When each first refractive material layer has a refractive index of 2.3 and the second refractive material layer has a refractive index of 1.6, the high reflection layer may have the reflectivity of 12.1%. When each first refractive material layer has a refractive index of 2.3 and the second refractive material layer has a refractive index of 1.7, the high reflection layer may have the reflectivity of 8.6%. When each first refractive material layer has a refractive index of 2.4 and the second refractive material layer has a refractive index of 1.5, the high reflection layer may have the reflectivity of 19.2%. When each first refractive material layer has a refractive index of 2.4 and the second refractive material layer has a refractive index of 1.6, the high reflection layer may have the reflectivity of 14.7%. When each first refractive material layer has a refractive index of 2.4 and the second refractive material layer has a refractive index of 1.7, the high reflection layer may have the reflectivity of 11%. As can be seen from the above, the larger the difference between the refractive index of the first refractive material layer and the refractive index of the second refractive material layer, the larger the reflectivity of the high reflection layer.

TABLE 2

| Reflectivity of high reflection layer | Refractive index of second refractive material layer | | |
|---|---|---|---|
| | 1.5 | 1.6 | 1.7 |
| Refractive index of first refractive material layer 2.2 | 26.8% | 19.7% | 13.5% |
| 2.3 | 32.0% | 24.6% | 18.0% |
| 2.4 | 36.9% | 29.4% | 22.6% |

As shown in Table 2, the high reflection layer includes three first refractive material layers and two second refractive material layers. When each first refractive material layer has a refractive index of 2.2 and each second refractive material layer has a refractive index of 1.5, the high reflection layer may have the reflectivity of 26.8%. When each first refractive material layer has a refractive index of 2.2 and each second refractive material layer has a refractive index of 1.6, the high reflection layer may have the reflectivity of 19.7%. When each first refractive material layer has a refractive index of 2.2 and each second refractive material layer has a refractive index of 1.7, the high reflection layer may have the reflectivity of 13.5%. When each first refractive material layer has a refractive index of 2.3 and each second refractive material layer has a refractive index of 1.5, the high reflection layer may have the reflectivity of 32%. When each first refractive material layer has a refractive index of 2.3 and each second refractive material layer has a refractive index of 1.6, the high reflection layer may have the reflectivity of 24.6%. When each first refractive material layer has a refractive index of 2.3 and each second refractive material layer has a refractive index of 1.7, the high reflection layer may have the reflectivity of 18%. When each first refractive material layer has a refractive index of 2.4 and each second refractive material layer has a refractive index of 1.5, the high reflection layer may have the reflectivity of 36.9%. When each first refractive material layer has a refractive index of 2.4 and each second refractive material layer has a refractive index of 1.6, the high reflection layer may have the reflectivity of 29.4%. When each first refractive material layer has a refractive index of 2.4 and each second refractive material layer has a refractive index of 1.7, the high reflection layer may have the reflectivity of 22.6%. As can be seen from the above, the larger the difference between the refractive index of the first refractive material layer and the refractive index of the second refractive material layer, the larger the reflectivity of the high reflection layer.

TABLE 3

| Reflectivity of high reflection layer | Refractive index of second refractive material layer | | |
|---|---|---|---|
| | 1.5 | 1.6 | 1.7 |
| Refractive index of first refractive material layer 2.2 | 41.5% | 31.6% | 22.5% |
| 2.3 | 48.1% | 38.5% | 29.1% |
| 2.4 | 54.0% | 44.9% | 35.7% |

As shown in Table 3, the high reflection layer includes four first refractive material layers and three second refractive material layers. When each first refractive material layer has a refractive index of 2.2 and each second refractive material layer has a refractive index of 1.5, the high reflection layer may have the reflectivity of 41.5%. When each first refractive material layer has a refractive index of 2.2 and each second refractive material layer has a refractive index of 1.6, the high reflection layer may have the reflectivity of 31.6%. When each first refractive material layer has a refractive index of 2.2 and each second refractive material layer has a refractive index of 1.7, the high reflection layer may have the reflectivity of 22.5%. When each first refractive material layer has a refractive index of 2.3 and each second refractive material layer has a refractive index of 1.5, the high reflection layer may have the reflectivity of 48.1%. When each first refractive material layer has a refractive index of 2.3 and each second refractive material layer has a refractive index of 1.6, the high reflection layer may have the reflectivity of 38.5%. When each first refractive material layer has a refractive index of 2.3 and each second refractive material layer has a refractive index of 1.7, the high reflection layer may have the reflectivity of 29.1%. When each first refractive material layer has a refractive index of 2.4 and each second refractive material layer has a refractive index of 1.5, the high reflection layer may have the reflectivity of 54%. When each first refractive material layer has a refractive index of 2.4 and each second refractive material layer has a refractive index of 1.6, the high reflection layer may have the reflectivity of 44.9%. When each first refractive material layer has a refractive index of 2.4 and each second refractive material layer has a refractive index of 1.7, the high reflection layer may have the reflectivity of 35.7%. As can be seen from the above, the larger the difference between the refractive index of the first refractive material layer and the refractive index of the second refractive material layer, the larger the reflectivity of the high reflection layer.

As shown in Tables 1 to 3, through selecting material for the first refractive material layers and material for the second refractive material layers, and adjusting the quantity of the first refractive material layers, the quantity of the second refractive material layers, the thickness of each first refractive material layer, and the thickness of each second refractive material layer, it is able to adjust the reflectivity and the light transmissivity of the high reflection layer, thereby to achieve the reflectivity and the light transmissivity close to reflectivity and light transmissivity of a semitransparent metallic cathode. In addition, the more quantities of the first refractive material layers and the second refractive material layers, the larger the reflectivity of the high reflection layer, and the less quantities of the first refractive material layers and the second refractive material layers, the lower the light transmissivity of the high reflection layer. However, when the light transmissivity of the high reflection layer is too low, the light transmissivity of the OLED display substrate may be adversely affected. Hence, it is inappropriate to provide too many first refractive material layers and second refractive material layers. In a possible embodiment of the present disclosure, the reflectivity of the high reflection layer may not be greater than 40%. At this time, the high reflection layer may include two first refractive material layers and one second refractive material layer, or include three first refractive material layers and two second refractive material layers.

When the reflectivity of the high reflection layer is relatively low, the light extraction efficiency of the OLED display substrate may be relatively low too. In a possible embodiment of the present disclosure, the reflectivity of the high reflection layer may be greater than or equal to 6%, and the threshold may be 6%, 7%, 8% or 9%.

In a possible embodiment of the present disclosure, as shown in FIG. 4, the high reflection layer may sequentially include, in a direction toward the transparent anode layer, the first refractive material layer 71 having a thickness in a range of from 120 nm to 140 nm and a refractive index in a range of from 2.2 to 2.4, the second refractive material layer 72 having a thickness in a range of from 120 nm to 140 nm and a refractive index in a range of from 1.5 to 1.7, the first refractive material layer 71 having a thickness in a range of from 120 nm to 140 nm and a refractive index in a range of from 2.2 to 2.4, the second refractive material layer 72 having a thickness in a range of from 120 nm to 140 nm and a refractive index in a range of from 1.5 to 1.7, and the first refractive material layer 71 having a thickness in a range of from 120 nm to 140 nm and a refractive index in a range of from 2.2 to 2.4.

Figure 6:
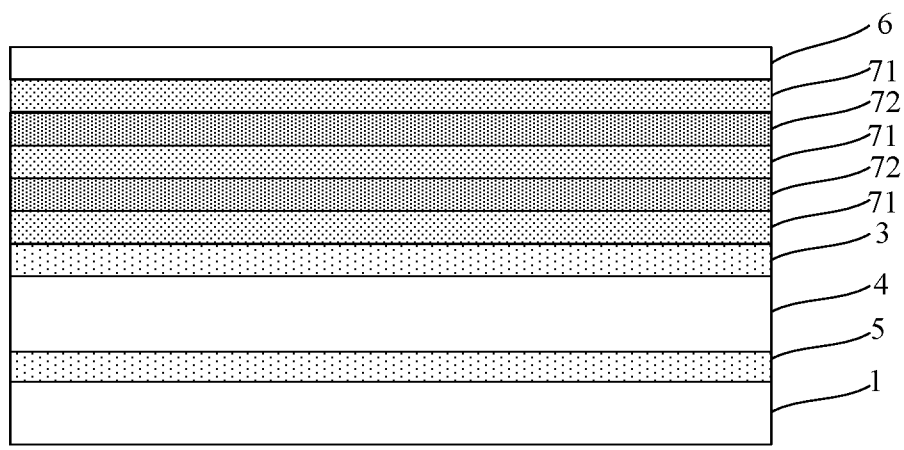
FIG. 6 is a schematic view showing the OLED display substrate according to some embodiments of the present disclosure.

As shown in FIG. 6, the OLED display substrate may sequentially include, from bottom to top, the reflective cathode layer 5, the organic light-emitting layer 4, the transparent anode layer 3, the first refractive material layer 71, the second refractive material layer 72, the first refractive material layer 71, the second refractive material layer 72 and the first refractive material layer 71 arranged on the substrate 1.

To be specific, each first refractive material layer 71 may be made of $TiO_2$ or ITO, and each second refractive material layer 72 may be made of organic resin. It should be appreciated that, the first refractive material layer and the second refractive material layer may each be made of any other transparent material having a certain refractive index. As shown in FIG. 3, the transparent anode layer 3 may be made of a material having a refractive index smaller than the first refractive material layer 71, e.g., IZO ($In_2O_3$:ZnO), GITO (GaInSnO) or ZITO (ZnInSnO). Alternatively, the first refractive material layer 71 may further serve as the transparent anode layer, and in this case, as shown in FIG. 3, the transparent anode layer 3 may be omitted, i.e., the high reflection layer 7 may be directly arranged on the organic light-emitting layer 4.

In a possible embodiment of the present disclosure, as shown in FIGS. 3 and 6, the OLED display substrate may further include an encapsulation layer 6 arranged on the high reflection layer 7, so as to protect the OLED display substrate from moisture and oxygen, thereby to prolong a service life of the OLED display substrate.

The high reflection layer 7 may be of a multi-layered structure and include at least two first refractive material layers and at least one second refractive material layer alternately arranged one on top of another, each first refractive material layer may be made of an inorganic material, and each second refractive material layer may be made of organic resin, i.e., the high reflection layer may include inorganic layers and organic layers arranged alternately. Usually, the encapsulation layer also includes inorganic layers and organic layers arranged alternately. Hence, parts or all of the layers of the high reflection layer 7 may serve as the encapsulation layer. At this time, it is unnecessary to provide the encapsulation layer 6 separately, thereby to reduce the thickness of the entire OLED display substrate.

In a possible embodiment of the present disclosure, the reflective cathode layer 5 may be made of metal and have a thickness of greater than or equal to 100 nm. In this way, it is able to provide the reflective cathode layer 5 with very high reflectivity, thereby to improve the luminous efficiency of the OLED display substrate.

The present disclosure further provides in some embodiments a display device including the above-mentioned OLED display substrate. The display device may be any product or member having a display function, e.g., television, display, digital photo frame, mobile phone or flat-panel computer. The display device may further include a flexible circuit board, a printed circuit board and a back plate.

The present disclosure further provides in some embodiments a method for manufacturing an OLED display substrate, which includes forming a reflective cathode layer, an organic light-emitting layer, a transparent anode layer and a high reflection layer sequentially on a substrate. The high reflection layer has reflectivity greater than a threshold and the high reflection layer is configured to reflect a light beam emitted from the organic light-emitting layer.

According to the embodiments of the present disclosure, the high reflection layer having certain reflectivity and configured to reflect the light beam emitted from the organic light-emitting layer is arranged on the transparent anode layer, so as to form an optical resonator (i.e., an optical microcavity) between the high reflection layer and the reflective cathode layer at the bottom of the OLED display substrate. As a result, it is able to improve the light extraction efficiency at a specific wavelength, narrow the spectrum, and improve the luminous efficiency, color gamut and color purity of the OLED display substrate, thereby to prevent the luminous efficiency, color gamut and color purity of the inverted OLED display substrate from being adversely affected due to the relatively low reflectivity of the transparent anode layer.

In a possible embodiment of the present disclosure, the forming the high reflection layer includes forming at least two first refractive material layers and at least one second refractive material layer alternately on the transparent anode layer, and each first refractive material layer has a refractive index greater than that of the second refractive material layer.

In a possible embodiment of the present disclosure, the high reflection layer may be of multi-layered structure consisting of an odd number of layers. To be specific, as shown in FIGS. 4, 5 and 7, the high reflection layer 7 may include at least two first refractive material layers 71 and at least one second refractive material layer 72 arranged alternately. The quantity of the first refractive material layers 71 and the quantity of the second refractive material layers 72 may be determined based on the reflectivity of the high reflection layer 7 to be formed. Each first refractive material layer 71 has a refractive index greater than that of each second refractive material layer 72.

To be specific, each first refractive material layer 71 may have a thickness of $\lambda/4n_1$, and each second refractive material layer 72 may have a thickness of $\lambda/4n_2$, where $\lambda$ represents a wavelength of the light beam emitted from the organic light-emitting layer 4, $n_1$ represents the refractive index of the first refractive material layer 71, and $n_2$ represents the refractive index of the second refractive material layer 72. Through the first refractive material layer 71 with the above thickness and the second refractive material layer 72 with the above thickness, it is able for the light beam to pass through the high reflection layer 7 more easily, thereby to optimize the light extraction efficiency.

Through selecting materials for the first refractive material layers and the second refractive material layers, and adjusting the quantity of the first refractive material layers, the quantity of the second refractive material layers, the thickness of each first refractive material layer, and the thickness of each second refractive material layer, it is able to adjust the reflectivity and the light transmissivity of the high reflection layer, thereby to achieve the reflectivity and the light transmissivity close to reflectivity and light transmissivity of a semitransparent metallic cathode. In addition, the more quantities of the first refractive material layers and the second refractive material layers, the larger the reflectivity of the high reflection layer, and the less quantities of the first refractive material layers and the second refractive material layers, the lower the light transmissivity of the high reflection layer. However, when the light transmissivity of the high reflection layer is too low, the light transmissivity of the OLED display substrate may be adversely affected. Hence, it is inappropriate to provide too many first refractive material layers and second refractive material layers. In a possible embodiment of the present disclosure, the reflectivity of the high reflection layer may not be greater than 40%. At this time, the high reflection layer may include two first refractive material layers and one second refractive material layer, or include three first refractive material layers and two second refractive material layers.

When the reflectivity of the high reflection layer is relatively low, the light extraction efficiency of the OLED display substrate may be relatively low too. In a possible embodiment of the present disclosure, the reflectivity of the high reflection layer may be greater than or equal to 6%, and the threshold may be 6%, 7%, 8% or 9%.

In a possible embodiment of the present disclosure, the forming the high reflection layer includes: forming sequentially on the transparent anode layer, in a direction toward the transparent anode layer, the first refractive material layer having a thickness in a range of from 120 nm to 140 nm and a refractive index in a range of from 2.2 to 2.4, the second refractive material layer having a thickness in a range of from 120 nm to 140 nm and a refractive index in a range of from 1.5 to 1.7, the first refractive material layer having a thickness in a range of from 120 nm to 140 nm and a refractive index in a range of from 2.2 to 2.4, the second refractive material layer having a thickness in a range of from 120 nm to 140 nm and a refractive index in a range of from 1.5 to 1.7, and the first refractive material layer having a thickness in a range of from 120 nm to 140 nm and a refractive index in a range of from 2.2 to 2.4.

In a possible embodiment of the present disclosure, the method further includes forming an encapsulation layer on the high reflection layer. Through the encapsulation layer, it is able to protect the OLED display substrate from moisture and oxygen, thereby to prolong a service life of the OLED display substrate.

The high reflection layer 7 may be of a multi-layered structure and include at least two first refractive material layers and at least one second refractive material layer arranged alternately, each first refractive material layer may be made of an inorganic material, and each second refractive material layer may be made of organic resin, i.e., the high reflection layer may include inorganic layers and organic layers arranged alternately. Usually, the encapsulation layer also includes inorganic layers and organic layers arranged alternately. Hence, parts or all of the layers of the high reflection layer may serve as the encapsulation layer. At this time, it is unnecessary to provide the encapsulation layer 6 separately, thereby to reduce the thickness of the entire OLED display substrate.

The method for manufacturing the OLED display substrate will be described hereinafter in more details.

In a possible embodiment of the present disclosure, the method may include the following steps.

Step 1: forming a driving circuit and the reflective cathode layer 5 on a clean base substrate. The reflective cathode layer 5 may be made of metal and have a thickness greater than or equal to 100 nm, so as to provide the reflective cathode layer 5 with very high reflectivity.

Step 2: forming the organic light-emitting layer 4 through a process such as vacuum evaporation or inkjet printing. The organic light-emitting layer 4 may include OLED functional layers and an emitting layer. Usually, the OLED functional layers include a Hole Injection Layer (HIL), a Hole Transport Layer (HTL), an Electron Barrier Layer (EBL), a Hole Barrier Layer (HBL), an Electron Transport Layer (ETL) and an Electron Injection Layer (EIL). The emitting layer includes a Red Emitting Layer (REML), a Green Emitting Layer (GEML), and a Blue Emitting Layer (BEML).

Step 3: forming the transparent anode layer 3 on the organic light-emitting layer 4. The transparent anode layer 3 may be made of a material having a relatively low refractive index, e.g., IZO ($In_2O_3$:ZnO), GITO (GaInSnO) or ZITO (ZnInSnO).

Step 4: forming an ITO layer through sputtering to obtain the first refractive material layer 71 having a thickness of 130 nm and a refractive index in a range of from 2.2 to 2.4, forming an organic layer having a relatively low refractive index through vacuum evaporation to obtain the second refractive material layer 72 having a thickness of 130 nm and a refractive index in a range of from 1.5 to 1.7, forming an ITO layer through sputtering to obtain the first refractive material layer 71 having a thickness of 130 nm and a refractive index in a range of from 2.2 to 2.4, forming an organic layer having a relatively low refractive index through vacuum evaporation to obtain the second refractive material layer 72 having a thickness of 130 nm and a refractive index in a range of from 1.5 to 1.7, and forming an ITO layer through sputtering to obtain the first refractive material layer 71 having a thickness of 130 nm and a refractive index in a range of from 2.2 to 2.4, thereby to acquire the high reflection layer as shown in FIG. 4.

Step 5: forming the encapsulation layer 6 for encapsulating the OLED device, so as to acquire the OELD display substrate as shown in FIG. 6.

In another possible embodiment of the present disclosure, the method for manufacturing the OLED display substrate may include the following steps.

Step 1: forming a driving circuit and the reflective cathode layer 5 on a clean base substrate. The reflective cathode layer 5 may be made of metal and have a thickness greater than or equal to 100 nm, so as to provide the reflective cathode layer 5 with very high reflectivity.

Step 2: forming the organic light-emitting layer 4 through vacuum evaporation or inkjet printing. The organic light-emitting layer 4 may include OLED functional layers and a light-emitting layer. Usually, the OLED functional layers include a hole injection layer, a hole transport layer, an electron barrier layer, a hole barrier layer, an electron transport layer, and an electron injection layer. The light-emitting layer includes a red light-emitting layer, a green light-emitting layer, and a blue light-emitting layer.

Step 3: forming the transparent anode layer 3 through sputtering. The transparent anode layer 3 may be made of ITO, and have a thickness of 130 nm and a refractive index in a range of from 2.2 to 2.4. The transparent anode layer 3 may further serve as the first refractive material layer 71.

Step 4: forming an organic layer having a relatively low refractive index through vacuum evaporation to obtain the second refractive material layer 72 having a thickness of 130 nm and a refractive index in a range of from 1.5 to 1.7, forming a titanium oxide layer through Chemical Vapor Deposition (CVD) to obtain the first refractive material layer 71 having a thickness of 130 nm and a refractive index in a range of from 2.2 to 2.4, forming an organic layer having a relatively low refractive index through vacuum evaporation to obtain the second refractive material layer 72 having a thickness of 130 nm and a refractive index in a range of from 1.5 to 1.7, and forming a titanium oxide layer through CVD to obtain the first refractive material layer 71 having a thickness of 130 nm and a refractive index in a range of from 2.2 to 2.4, thereby to acquire the high reflection layer as shown in FIG. 4.

Step 5: forming the encapsulation layer for encapsulating the OLED device, so as to acquire the OELD display substrate as shown in FIG. 6.

In the embodiments of the present disclosure, the order of the steps may not be limited to the serial numbers thereof. For a person skilled in the art, any change in the order of the steps shall also fall within the scope of the present disclosure if it is without any creative effort.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An Organic Light-Emitting Diode (OLED) display substrate, comprising: a reflective cathode layer, an organic light-emitting layer, a transparent anode layer, and a high reflection layer arranged sequentially on a substrate,
   wherein the high reflection layer is configured to reflect a light beam emitted from the organic light-emitting layer, and reflectivity of the high reflection layer with respect to the light beam emitted from the organic light-emitting layer is greater than 6%,
   the high reflection layer is of a multi-layered structure, and comprises at least two first refractive material layers and at least one second refractive material layer, the at least two first refractive material layers and the at least one second refractive material layer are alternately arranged one on top of another, and a refractive index of each of the at least two first refractive material layers is greater than a refractive index of each of the at least one second refractive material layer.

2. The OLED display substrate according to claim 1, wherein a thickness of each first refractive material layers is $\lambda/4n_1$, and a thickness of each second refractive material layer is $\lambda/4n_2$, where $\lambda$ represents a wavelength of the light beam emitted from the organic light-emitting layer, $n_1$ represents the refractive index of the first refractive material layer, and $n_2$ represents the refractive index of the second refractive material layer.

3. The OLED display substrate according to claim 1, wherein
the high reflection layer comprises two first refractive material layers and one second refractive material layer alternately arranged one on top of another.

4. The OLED display substrate according to claim 1, wherein
the high reflection layer comprises three first refractive material layers and two second refractive material layers alternately arranged one on top of another.

5. The OLED display substrate according to claim 4, wherein the high reflection layer sequentially comprises, in a direction toward the transparent anode layer:
a first refractive material layer having a thickness in a range of from 120 nm to 140 nm and a refractive index in a range of from 2.2 to 2.4;
a second refractive material layer having a thickness in a range of from 120 nm to 140 nm and a refractive index in a range of from 1.5 to 1.7;
a first refractive material layer having a thickness in a range of from 120 nm to 140 nm and a refractive index in a range of from 2.2 to 2.4;
a second refractive material layer having a thickness in a range of from 120 nm to 140 nm and a refractive index in a range of from 1.5 to 1.7; and
a first refractive material layer having a thickness in a range of from 120 nm to 140 nm and a refractive index in a range of from 2.2 to 2.4.

6. The OLED display substrate according to claim 1, wherein
each first refractive material layer is made of titanium oxide ($TiO_2$) or Indium Tin Oxide (ITO), and each second refractive material layer is made of organic resin.

7. The OLED display substrate according to claim 1, wherein
the reflective cathode layer is configured to reflect the light beam reflected by the high reflection layer, to form an optical resonator between the high reflection layer and the reflective cathode layer.

8. The OLED display substrate according to claim 1, wherein
the reflective cathode layer is made of metal, and a thickness of the reflective cathode layer is greater than or equal to 100 nm.

9. The OLED display substrate according to claim 1, wherein
the reflectivity of the high reflection layer with respect to the light beam emitted from the organic light-emitting layer is not greater than 40%.

10. The OLED display substrate according to claim 1, wherein
the OLED display substrate further comprises an encapsulation layer arranged on the high reflection layer; or
at least a portion of the high reflection layer further serves as the encapsulation layer.

11. A display device, comprising an OLED display substrate, wherein the OLED display substrate comprises: a reflective cathode layer, an organic light-emitting layer, a transparent anode layer, and a high reflection layer arranged sequentially on a substrate,
wherein the high reflection layer is configured to reflect a light beam emitted from the organic light-emitting layer, and reflectivity of the high reflection layer with respect to the light beam emitted from the organic light-emitting layer is greater than 6%,
the high reflection layer is of a multi-layered structure, and comprises at least two first refractive material layers and at least one second refractive material layer, the at least two first refractive material layers and the at least one second refractive material layer are alternately arranged one on top of another, and a refractive index of each of the at least two first refractive material layers is greater than a refractive index of each of the at least one second refractive material layer.

12. The display device according to claim 11, wherein
a thickness of each first refractive material layers is $\lambda/4n_1$, and a thickness of each second refractive material layer is $\lambda/4n_2$, where $\lambda$ represents a wavelength of the light beam emitted from the organic light-emitting layer, $n_1$ represents the refractive index of the first refractive material layer, and $n_2$ represents the refractive index of the second refractive material layer.

13. The display device according to claim 11, wherein
the high reflection layer comprises three first refractive material layers and two second refractive material layers arranged one on top of another alternately.

14. The display device according to claim 13, wherein the high reflection layer sequentially comprises, in a direction toward the transparent anode layer:
a first refractive material layer having a thickness in a range of from 120 nm to 140 nm and a refractive index in a range of from 2.2 to 2.4;
a second refractive material layer having a thickness in a range of from 120 nm to 140 nm and a refractive index in a range of from 1.5 to 1.7;
a first refractive material layer having a thickness in a range of from 120 nm to 140 nm and a refractive index in a range of from 2.2 to 2.4;
a second refractive material layer having a thickness in a range of from 120 nm to 140 nm and a refractive index in a range of from 1.5 to 1.7; and
a first refractive material layer having a thickness in a range of from 120 nm to 140 nm and a refractive index in a range of from 2.2 to 2.4.

15. A method for manufacturing an OLED display substrate, comprising:
forming a reflective cathode layer, an organic light-emitting layer, a transparent anode layer and a high reflection layer sequentially on a substrate,
wherein the high reflection layer is configured to reflect a light beam emitted from the organic light-emitting layer, and reflectivity of the high reflection layer with respect to the light beam emitted from the organic light-emitting layer is greater than 6%,
the high reflection layer is of a multi-layered structure, and comprises at least two first refractive material layers and at least one second refractive material layer, the at least two first refractive material layers and the at least one second refractive material layer are alternately arranged one on top of another, and a refractive index of each of the at least two first refractive material layers is greater than a refractive index of each of the at least one second refractive material layer.

16. The method according to claim 15, wherein the forming the high reflection layer comprises:
  forming the at least two first refractive material layers and the at least one second refractive material layer alternately on the transparent anode layer.

17. The method according to claim 16, wherein forming the at least two first refractive material layers and the at least one second refractive material layer alternately on the transparent anode layer comprises: forming following layers sequentially on the transparent anode layer in a direction toward the transparent anode layer:
  a first refractive material layer having a thickness in a range of from 120 nm to 140 nm and a refractive index in a range of from 2.2 to 2.4;
  a second refractive material layer having a thickness in a range of from 120 nm to 140 nm and a refractive index in a range of from 1.5 to 1.7;
  a first refractive material layer having a thickness in a range of from 120 nm to 140 nm and a refractive index in a range of from 2.2 to 2.4;
  a second refractive material layer having a thickness in a range of from 120 nm to 140 nm and a refractive index in a range of from 1.5 to 1.7; and
  a first refractive material layer having a thickness in a range of from 120 nm to 140 nm and a refractive index in a range of from 2.2 to 2.4.

18. The method according to claim 15, further comprising:
  forming an encapsulation layer on the high reflection layer.

\* \* \* \* \*